United States Patent [19]

Melngailis et al.

[11] 4,342,970
[45] Aug. 3, 1982

[54] ACOUSTIC WAVE DEVICE

[75] Inventors: John Melngailis, Newton; Hermann A. Haus, Lexington; Ana L. Lattes, Boston, all of Mass.

[73] Assignee: Massachusetts Institute of Technology, Cambridge, Mass.

[21] Appl. No.: 233,320

[22] Filed: Feb. 11, 1981

[51] Int. Cl.³ .................... H03H 9/25; H03H 9/64
[52] U.S. Cl. .................... 333/142; 333/153; 333/195
[58] Field of Search .................... 333/150–155, 333/193–196, 141–142; 310/313 R, 313 A, 313 B, 313 C, 313 D

[56] References Cited

U.S. PATENT DOCUMENTS 4,268,808  5/1981  Melngailis ............ 333/195

FOREIGN PATENT DOCUMENTS 1543417  4/1979  United Kingdom ............ 333/193

*Primary Examiner*—Marvin L. Nussbaum
*Attorney, Agent, or Firm*—Arthur A. Smith, Jr.; Mark G. Lappin

[57] ABSTRACT

A surface acoustic wave (SAW) device including a crystal substrate having two substantially planar surfaces and at least one SAW-to-plate mode coupler positioned on one of the surfaces. The SAW-to-plate mode coupler includes a plurality of parallel, linear surface perturbations. The surface perturbations are adapted to convert a portion of an incident SAW to a bulk acoustic wave (BAW). In addition, the coupler is adapted to convert a portion of an incident BAW (from the crystal bulk region) to a SAW at those surface perturbations. In addition, the planar surfaces of the crystal substrate are adapted to reflect portions of incident BAW's. The coupler is positioned with respect to the crystal characteristics so that SAW's and BAW's resonantly interact at the coupler. In alternative configurations, a second SAW-to-plate mode coupler is positioned on the second surface of the crystal substrate. This second surface coupler also is adapted to convert a portion of an incident SAW to a bulk acoustic wave (BAW) at a plurality of parallel surface perturbations, and to convert a portion of an incident BAW to a SAW at those perturbations. The couplers are positioned in view of the crystal characteristics so that the BAW's and SAW's resonantly interact at the couplers.

9 Claims, 5 Drawing Figures

ACOUSTIC WAVE DEVICE

REFERENCE TO RELATED APPLICATION

The subject matter in this application is related to that in U.S. patent application Ser. No. 040,667, filed May 21, 1979, now U.S. Pat. No. 4,268,808.

BACKGROUND OF THE DISCLOSURE

The present invention is directed to acoustic wave devices and, more particularly, to surface acoustic wave filters.

In the prior art, a number of acoustic wave devices are based on the interaction between an acoustic wave traveling on the surface of the crystal and a surface perturbation, such as a shallow groove grating on that surface. Such devices include filter banks, resonators, and reflective array compressors (RAC's). These prior art devices have all been "single surface" devices, that is, the input surface acoustic wave, the surface perturbation, and the output surface acoustic wave are all on the same surface of the crysal.

By way of example, a prior art filter may be constructed on the top surface of a crystal by placing a shallow groove grating on that surface. In response to a broadband surface excitation, a spectrum of surface acoustic waves (SAW's) may be generated which travel toward the grating at an oblique angle. At the grating, the input SAW's are split into two components. For a component of the input SAW where the inter-groove spacing (in the propagation direction of the incident SAW) of the grating is equal to the SAW wavelength, a first output SAW component is produced which travels in a direction having its angle of reflection with respect to the grating grooves equal to the angle of incidence with respect to those grooves. The other portion of the input SAW produces a second output SAW component which travels from the grating along the crystal surface in substantially the same direction as the incident SAW. The reflection coefficient for the first output component is proportional to the ratio of the depth of the groove to the wavelength of the incident wave. With this configuration, a sensor which is aligned to detect the first output SAW component exhibits a transmission pass-band at the frequency associated with the grating spacing. Similarly, a sensor which is aligned to detect the second output SAW component exhibits a transmission stop-band at the frequency associated with the grating spacing. While this prior art configuration does provide stop and pass-band filters for a surface acoustic wave, the Q of the band characteristic is relatively low.

Another form of prior art device includes a pair of parallel shallow groove gratings on a single surface of a crystal, with the elements of each grating having a separation equal to one-half the wavelength of the characteristic frequency for the resonator. The device provides a resonant peak at the characteristic frequency. However, this configuration is relatively limited with respect to its Q characteristic.

The prior art reflective array compressor devices generally include two shallow groove gratings on a single crystal surface. The elements of both gratings have matching monotonic inter-groove separation functions. The two gratings are set at an angle to each other so that a broad band SAW directed at the first grating travels toward the first grating, and the various frequency components of that SAW are reflected on the grooves having a spacing matching the wavelength of the components. The reflected components travel to the correspondingly spaced grooves of the second grating, and are then in turn reflected to an output transducer. By conventional techniques, the two gratings may be adapted to provide a phase response corresponding to a linear chirp, i.e., the phase response is a quadratic function of frequency. These prior art devices have been found to have relatively high loss due to the SAW reflection coefficients.

While the above described examples from the prior art are defined to make use of shallow groove gratings, it is known that other forms of surface perturbations may be used, such as films, or field shorting elements for piezoelectric crystals.

It is an object of the present invention to provide improved acoustic wave devices.

Another object is to provide a relatively high Q acoustic wave filter.

It is still another object to provide a new and improved acoustic wave reflective array compressor device.

Yet another object is to provide a relatively high finesse acoustic wave resonator.

BRIEF DESCRIPTION OF THE DRAWINGS

The foregoing and other objects of this invention, the various features thereof, as well as the invention itself, may be more fully understood from the following description, when read together with the accompanying drawings in which.

SUMMARY OF THE INVENTION

Figure 1:
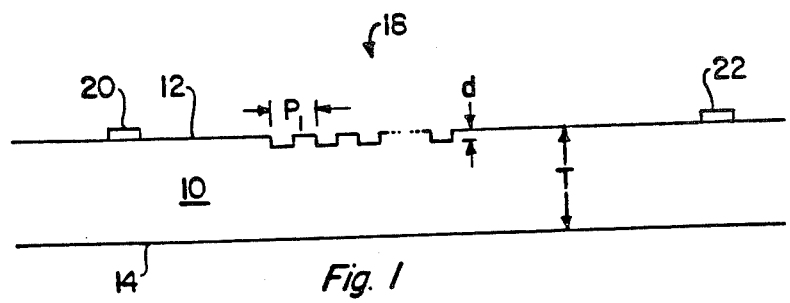
FIGS. 1–5 show exemplary embodiments of the present invention.

Briefly, according to the present invention, a surface acoustic wave filter includes a crystal substrate having two substantially planar surfaces and at least one SAW-to-plate mode coupler positioned on one of the surfaces. The SAW-to-plate mode coupler includes a plurality of parallel, linear surface perturbations. The surface perturbations are adapted to convert a portion of an incident SAW to a bulk acoustic wave (BAW), and to convert a portion of an incident BAW (from the crystal bulk region) to a SAW. In addition, the planar surfaces of the crystal substrate are adapted to reflect portions of incident BAW's.

By way of example, the surface perturbations may take the form of a shallow groove grating, an array of film elements, or an array of field shorting elements (for crystals that are piezoelectric). Other techniques may also be used for creating the surface wave/reflective bulk wave interactions.

With this configuration, conventional surface acoustic wave transducers may be positioned on the top surface of the crystal on either side of the surface perturbations so that the transducers respectively generate and receive acoustic waves travelling in a direction normal to the perturbations. Where the perturbations are periodically spaced, and the crystal has a predetermined thickness (related to the incident SAW wavelength, the perturbation period, and the characteristic velocity of BAW in the crystal), the transfer function between the input and output transducers is a plurality of relatively high Q stop bands.

In alternative configurations, a second SAW-to-plate mode coupler may be positioned on the second surface of the crystal substrate. This second surface coupler also is adapted to convert a portion of an incident SAW to a bulk acoustic wave (BAW) at a plurality of parallel surface perturbations, and to convert a portion of an incident BAW to a SAW at those perturbations. This second coupler may of course be of the same form as the coupler on the first surface. In one form, the perturbations of both first and second surface couplers are periodic and the periods are equal. In this form, with transducers positioned on opposite surfaces of the crystal and on opposite sides of the perturbations, the transfer characteristic between the input and output transducers is a plurality of pass-bands.

In yet another configuration having periodic couplers on both crystal surfaces, the periods of the first and second surface couplers differ. Here, a portion of an acoustic wave incident on the first surface coupler is converted to a BAW which travels to the second coupler. At the second surface coupler, a portion of the incident BAW is converted to a SAW on the second surface. By suitably selecting the crystal substrate thickness and the second surface coupler position and period with respect to the first surface coupler position and period, either the SAW-to-BAW conversion at the first surface coupler is forward directed (i.e. the BAW from that coupler has a velocity component in the same direction as the input SAW) and the BAW-to-SAW conversion at the second surface coupler is reverse directed (i.e. the SAW from that coupler has a velocity component in the direction opposite to the BAW incident to that coupler), or the SAW-to-BAW conversion at the first surface coupler is reverse directed (i.e. the BAW from that coupler has a velocity component in the opposite direction to the input SAW) and the BAW-to-SAW conversion at the second surface coupler is forward directed (i.e. the SAW from that coupler has a velocity component in the same direction as the BAW incident to that coupler). In either case, the transfer function between an input transducer (on one surface) and an output transducer (on the other surface and on the same side as the surface perturbations as the first coupler) includes a single pass-band about at a center frequency having a period between the two periods of the surface perturbations. The acoustic wave energy at that center frequency travels in a "U-path" from one transducer on one surface to the coupler on that surface, through the crystal bulk region to the other coupler, and then back to the transducer on the other surface.

In another form of the invention which includes couplers on both crystal surfaces, the spacing between the perturbations are matching monotonic functions for both surface couplers so that a reflective array compressor operation is established. The acoustic wave is in the form of a SAW from the input transducer to the first surface coupler. At the respective perturbations of that coupler, differing phased BAW's are generated. These BAW's are converted back to SAW's at corresponding perturbations at the second surface coupler. These SAW's propagate on the second surface in the opposite direction to the input SAW. Thus, in this form, a broadband input SAW produces a linear chirp with the input acoustic wave energy travelling in a "U-path" from a transducer to the coupler on the first surface, then through the substrate bulk region to the second coupler, and finally to a transducer on the second surface on the same side of the surface perturbations in the first coupler.

In yet another form of the invention, a pair of "U-path" filters, having the same identical center frequencies, are arranged in a mirror-image configuration on either side of input and output transducers on a crystal substrate. For acoustic waves at the center frequency, each filter includes a forward (or reverse) direction coupler on one surface and a reverse (or forward) direction coupler. The filters are positioned on the substrate to establish a standing wave at the center frequency, thereby providing a ring path resonator.

DESCRIPTION OF THE PREFERRED EMBODIMENT

FIG. 1 shows an embodiment of the present invention in section. This form of the invention includes a crystal substrate 10 having two substantially planar surfaces 12 and 14. In the present embodiment, the surfaces 12 and 14 are substantially parallel and separated by a distance T, although in alternative embodiments the surfaces 12 and 14 are not necessarily parallel. In the present embodiment, the crystal 10 may be YZ Lithium Niobate (LiNbO$_3$), with a thickness T=1.27 mm. In alternative embodiments, the substrate might be quartz, for example.

The upper surface 12 of substrate 10 includes a SAW-to-plate mode coupler 18. As shown, the coupler 18 is a shallow groove grating. The back surface 14 is relatively smooth, and adapted for reflecting bulk acoustic waves. By way of example, the grating may include 200 grooves etched by conventional techniques so that the grooves have a depth d=0.364 micrometers ($\mu$m) and a repetitive period P$_1$=20.32 $\mu$m. Surface acoustic wave transducers 20 and 22 are positioned on the surface 12 on opposite sides of the grating. The surface transducers may be conventional in form.

In the present embodiment, the grooves (defined as developed-out regions in photoresist (Shipley AZ1-35OJ)) are initially ion beam etched. The photoresist on the substrate is then dissolved in acetone. The crystal is etched for 10–15 seconds in a 1:1:1 solution of HF:HNO$_3$:H$_2$O. The entire bare surface is then ion etched again to remove about 0.2 $\mu$m of material. Finally, the substrate is again chemically etched for 10–15 seconds in the above solution.

With this configuration, a portion of a broadband SAW (produced by transducer 20) interacts with each groove edge to convert a portion of that wave to a bulk acoustic wave (BAW). For the SAW's component having a wavelength equal to the inter-groove spacing, the elements of the grating act as a plurality of inphase radiating sources where the resultant BAW is radiated directly downward away from the crystal surface 12. For the input SAW components having a wavelength differing from the intergroove period, the match is no longer perfect for normal incidence, and the resultant BAW propagates away from the grating at an angle for which the phase-matching is satisfied. For SAW components with frequencies which have wavelengths greater than the grating period, the BAW is "reverse directed", that is the BAW has a propagation direction shifted by more than 90 degrees from the input SAW propagation direction. For SAW components with wavelengths less than the grating period, the BAW is "forward directed", that is the BAW has a propagation direction shifted less than 90 degrees from the input SAW direction.

The bulk wave generated at the coupler 18 propagates toward surface 14 and bounces off that surface and returns to the coupler 18. Upon that return, a portion of that bulk wave is converted back to a SAW (in a "forward directed" conversion) while a portion of the bulk wave is reflected back to surface 14 of the crystal whereupon the process repeats. As described more fully below, the thickness of the crystal may be established with respect to the grating period and the SAW frequencies, so that resonant SAW-BAW coupling occurs at the coupler 18 and the BAW which converts back to a SAW at the surface 12 destructively interferes with the unconverted portion of the input SAW. With the partial conversion effect, the two surfaces of the crystal provide a repetitive bouncing back and forth of the BAW's and conversions with the SAW's.

With the present embodiment, in response to an input SAW in the frequency range 160–180 MHz, the resonant BAW-SAW interaction produces a transfer function between transducers 20 and 22 which may be characterized as a plurality of stop-bands on the order of 10 db deep. By increasing the groove depth to 0.48 um, some of the stop bands become relatively sharp with a depth as great as 50–60 db for an input SAW in the 180–200 MHz range, indicating that substantially all the surface wave energy in the stop-bands is converted to bulk wave energy.

Figure 2:
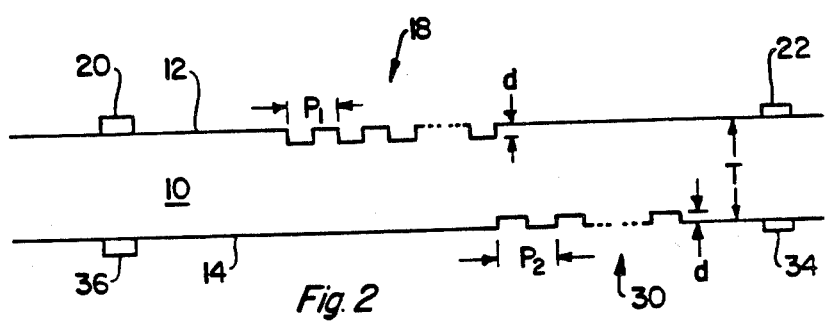

FIG. 2 shows an alternative configuration which is similar to the configuration of FIG. 1, where corresponding elements are denoted by identical reference designations. The configuration of FIG. 2 also includes a SAW-to-plate mode coupler 30 on surface 14. The coupler 30, as shown, also includes a plurality of linear parallel surface perturbations having a uniform periodic separation $P_2$. In the embodiment of FIG. 2, the grating grooves of couplers 18 and 30 are substantially mutually parallel although in other embodiments, the two sets of grooves may not necessarily be parallel. The embodiment of FIG. 2 also shows input transducer 20 as well as two additional output transducer 34 and 36 on surface 14 (on opposite sides of coupler 30). It will be understood that the transducers may all be conventional in form, and, depending upon various applications, may or may not actually be in place in all devices in accordance with the invention.

In the preferred form of the device of FIG. 2, the crystal substrate 10 is LiNbO$_3$, has a thickness T=1.27 mm, and the gratings of both couplers are periodic 200 groove gratings with 20.32 um periods, where the grooves are 0.47 um deep. Moreover, in the illustrated embodiment, the couplers 18 and 30 are non-overlapping, with the starting point of coupler 30 being positioned opposite the ending point of coupler 18. With this configuration, in response to a broadband SAW generated at transducer 20 toward coupler 18, energy transfer from surface 12 to surface 14 only occurs for a forward directed BAW from coupler 18, and thus only occurs for input SAW frequencies greater than 172 MHz. As a result, the transfer function between transducers 20 and 34 is characterized by a plurality of pass-bands, each having a center frequency greater than 172 MHz (i.e. having corresponding wavelengths less than $P_1$).

In response to a broadband SAW generated at transducer 22 toward coupler 18, energy transfer from surface 12 to surface 14 occurs for a reverse directed BAW from coupler 18, and thus only occurs for input SAW frequencies less than 172 MHz. Under these conditions, the transfer function between transducers 22 and 36 is characterized by a plurality of pass-bands, each having a center frequency less than 172 MHz (i.e. having corresponding wavelengths less than $P_1$).

In alternative embodiments, the couplers 18 and 30 may overlap with the result that the transfer functions of diagonally opposite transducer pairs may include pass-bands both above and below the frequency corresponding to a wavelength $P_1$.

Figure 3:
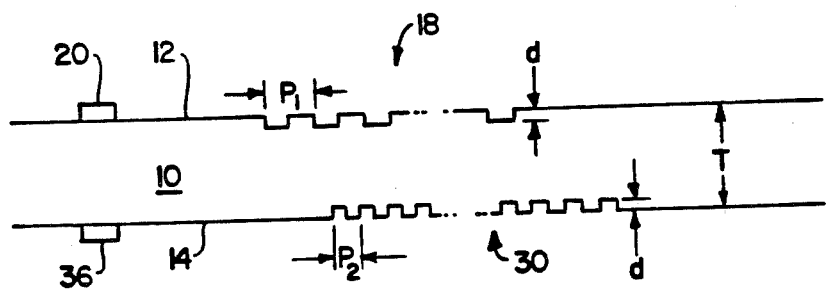

FIG. 3 shows another configuration which is substantially the same as the configuration of FIG. 2, except that the periods $P_1$ and $P_2$ of couplers 18 and 30, respectively, differ. As shown $P_1$ is greater than $P_2$. With this configuration, in response to a broadband SAW generated at transducer 20 toward coupler 18, energy transfer from surface 12 to surface 14 occurs primarily through the action of a forward directed BAW produced at coupler 18 and directed toward coupler 30. At coupler 30, this BAW is in part reflected and in part converted to a reverse directed (i.e. toward transducer 36) SAW. A portion of this SAW is reconverted to a BAW as the SAW encounters the subsequent groove of grating 30. This BAW propagates to coupler 18 where it is in part reflected, and in part converted to a SAW which resonantly interacts with the existing SAW at coupler 18. The remaining portion of the SAW at coupler 30 propagates to transducer 36. By appropriately selecting $P_1$ and $P_2$, there is only a single resonant frequency (having wavelength between $P_1$ and $P_2$) which resonantly interacts at both couplers. A portion of the SAW produced at coupler 30 at the resonant frequency propagates to transducer 36 so that the transfer function between transducers 20 and 36 is characterized by a single pass-band at the resonant frequency, thereby providing a narrow band, U-path filter.

While the present description is directed to the case where the input SAW is generated at transducer 20, it will be understood that an input SAW may just as well be applied at transducer 36. A portion of that SAW is converted to a reverse directed BAW which propagates toward coupler 18. At coupler 18, this BAW is in part reflected and in part resonantly converted to a SAW which propagates toward transducer 20. The reflected BAW resonantly interacts with the SAW at coupler 30. As a results, the portion of the input SAW at the resonant frequency is coupled to transducer 20. It should be noted that the device of FIG. 3 is a passive reciprocal device in that the input SAW may be applied either by way of transducer 20 (or transducer 36), with the other transducer 36 (or transducer 20) being the output transducer. In alternate forms, couplers 18 and 30 may not overlap.

In general, the dimensions of the device of FIG. 3 may be determined by considering the length of the propagation path of the input SAW through the grating of the couplers, in conjunction with the length of the propagation of the BAW's through the bulk region (from the crystal surface where the BAW was generated, to the opposite crystal surface, and as reflected back to the originating surface). The grating periods (which control the propagation angle of the BAW's with respect to the crystal surfaces) and the crystal thickness may be selected to establish orders of plate made acoustic waves which destructively interfere at the crystal surfaces.

In one form of the invention, the values for $P_1$ and $P_2$ may be predetermined for a known material, such as YZ-LiNbO$_3$. This material is characterized by a Rayleigh wave velocity ($C_r$) equal to 3485 m/sec, bulk share velocity ($C_{shear}$) equal to 4444 m/sec, bulk compressional velocity ($C_{compr}$) equal to 6883 m/sec. To determine the values $P_1$ and $P_2$, there are two conditions which must be solved for a desired pass-band at frequency, f:

$$2f = (C_r/P_1) + (C_r/P_2) \qquad (1)$$

and the other condition:

$$f^2/C^2 = [(f/c_r) - (1/P_1)]^2 + (n/2T)^2 \qquad (2)$$

where d equals the thickness of the crystal, and n corresponds to the order of the plate made that is excited by using either the bulk compression or bulk shear velocity for C. By way of example, for a YZLiNbO$_3$ crystal having thickness T=1.27 mm, a filter having a center frequency f=176 MHz, where n is selected to equal 100 and using C=4444 m/sec, then $P_1$=18.25 um and $P_2$=19.64 um. Under these conditions, there is coupling between the surface waves and a shear type plate mode of order 100 at the first surface. Furthermore, the second surface grating will also couple that plate mode to an oppositely directed surface wave.

Alternatively, the U-path filter of FIG. 3 may be configured by initially constructing a single surface coupler structure, such as that disclosed in conjunction with FIG. 1 including a grating with period $P_1$. After observing the stop bands generated by that structure resulting from coupler 18 and selecting one of those stop bands as the desired pass-band, the appropriate period, $P_2$, for the grating of coupler 30 may readily be determined using equation (1) above. The resultant structure with couplers 18 and 30 having periods $P_1$ and $P_2$, respectively, then provides a single pass-band between transducers 20 and 36 with a center frequency at the center of the selected pass-band.

Figure 4:
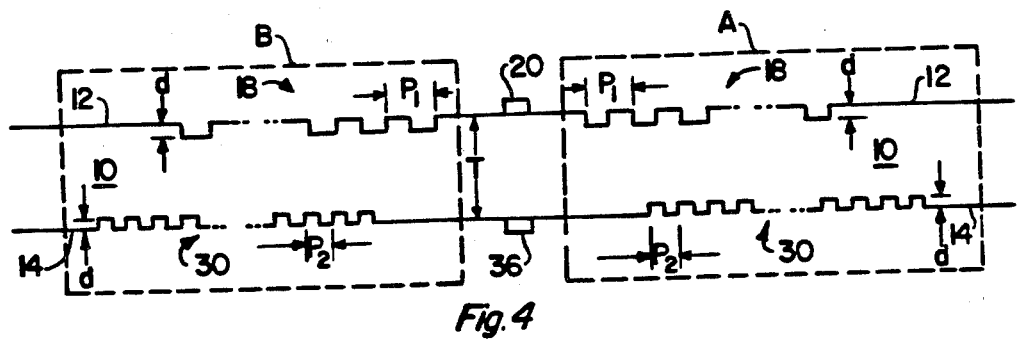

FIG. 4 shows another embodiment which includes two mirror-image portions (enclosed by broken lines A and B), each of which is substantially the same as the device shown in FIG. 3.

This configuration provides a ring path resonator or oscillator. Each of portions A and B function as described above in conjunction with FIG. 3. At resonance, an acoustic signal propagates around the device in both directions, forming standing waves at the positions of the input and output transducers 20 and 36. In alternate embodiments, only one of the transducers is used, thereby forming a one port resonator. In yet other embodiments, on or both transducers may be positioned outside the couplers on the respective surfaces 12 and 14, rather than between the couplers.

In these configurations, the resultant ring resonator provides relatively high Q compared with conventional surface acoustic wave resonators due to the avoidance of the propagation loss associated with the conventional resonators (since in the ring structure, a great deal of the propagation is in the bulk, and bulk wave propagation loss is substantially lower than surface wave loss).

Figure 5:
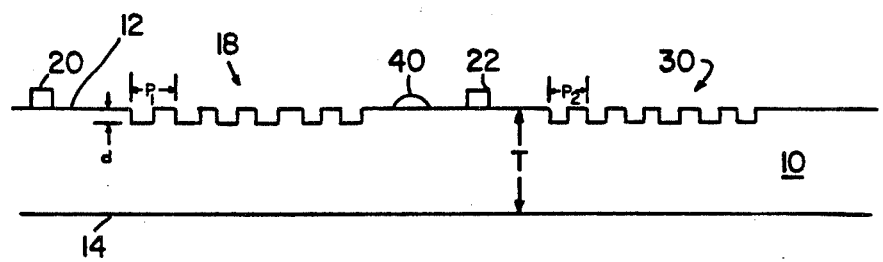

FIG. 5 shows an alternative band-pass filter configuration which has two couplers 18 and 30 (in the form of gratings) on a single surface. This structure is relatively easy to fabricate, compared with the configuration of FIG. 3 since all gratings and transducers are on a single surface.

Generally, the filter structuer of FIG. 5 includes a substrate 10, either a crystal or piezoelectric material, having a relatively smooth and parallel upper and lower surfaces 12 and 14. The upper surface 12 includes input transducer 20 and output transducer 22. Between these transducers, the upper surface includes a first coupler 18 comprising a parallel groove grating having a period $P_1$. A surface acoustic wave interrupter 40 is positioned on surface 12 between the coupler 18 and the transducer 22. As described below, there are a number of possible forms for this interrupter, with the preferred form being a strip of rubber cement extending parallel to the grating of coupler 18. Interrupter 40 substantially prevents the propagation of SAW's from transducer 20 to transducer 22, while not significantly affecting the propagation of BAW's within the crystal. The second coupler 30 is positioned on surface 12 on the other side of transducer 22. In the present embodiment, coupler 30 comprises a parallel groove grating having a spatial period $P_2$. In this configuration, the period $P_1$ for the coupler 18 is selected so that portions of an input SAW generated at transducer 20 and directed normal to the grating of coupler 18 is converted to a bulk acoustic wave (BAW) which has a component propagating in the same direction and which reflects back and forth between surfaces 12 and 14. The period $P_2$ of coupler 30 is selected so that the interaction of this BAW creates a reverse-directed (output) SAW on surface 12, i.e. a SAW moving from the grating of coupler 30 towards transducer 22. The periods $P_1$ and $P_2$ may be selected as described above, so that a single pass-band frequency is established for the transfer of function between transducers 20 and 22. With this embodiment, the input SAW may be generated at transducer 22 with the output SAW being received at transducer 20.

In practice, for example, a single pass-band filter having a center frequency approximately equal to 177.2 MHz may be constructed on YZ LiNbO$_3$ crystal having thickness T=1.27 mm and with gratings of depth d=0.48 um having periods $P_1$=20.32 um and $P_2$=19.05 um. With the configuration sheer type plate modes n=100 may be coupled on both sides of interrupter 40 to the oppositely directed SAW's of surface 12. The stop-band frequencies are nearly coincident for the gratings 18 and 30, although stop-band for the grating 30 is slightly lower in frequency. Then, the crystal thickness is trimmed. As the crystal thickness is decreased, the frequency of stop-band associated with coupler 30 increases faster than the frequency associated with the stop-band associated with coupler 18. The difference as a function of decreasing crystal thickness is on the order of 0.014 MHz/um. By way of example, this trimming may be achieved by conventional ion milling until the desired stop-bands for the two gratings are coincident and a pass-band is established. Alternatively, the stop-band overlap for the gratings could be blurred by broadening the stop-band associated with the respective gratings, for example, by chirping one of the grating periods by a small amount, i.e. slowly varying the period of the grating as a function of position.

Regarding the interrupter 40 in the structure of FIG. 5, the preferred form of the invention incorporates a SAW absorber such as a thin strip of rubber cement extending parallel to the grating. In alternative embodiments, an interrupter 40 may be a semi-conducting film, deposited between the coupler 18 and the transducer 22 on the surface 12, where the film has an appropriate sheet resistance so that it very strongly absorbs surface acoustic waves, yet has a relatively small effect on bulk plate modes. In another alternative form, interrupter 40 has a semi-conducting film between the coupler 18 and transducer 22 on the surface 12, where the film is patterned so that the plate mode "wavelength" along the surface is much longer than the Rayleigh wavelength along that surface. This latter form is particularly effective if the frequency of the SAW is approximately equal to $C_r/P$, where the $C_r$ is the Rayleigh wave velocity and P is the grating period. In this case, the plate mode wavelength along the surface is much greater than the grating period, the plate mode is minimally affected. In this form, the semi-conductor film minimizes loading. In yet another form, the interrupter 40 is a wedge (or prism) positioned between coupler 18 and transducer 22 on the surface 12. This prism is adapted to deflect, i.e. to shift the angle of propagation) of an incident SAW so that the deflected SAW becomes non-coherent with respect to the bulk wave within the substrate 10.

The invention may be embodied in other specific forms without departing from the spirit or essential chracteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:

1. A surface acoustic wave (SAW) device comprising:
   A. a crystal substrate having two substantially planar surfaces, said planar surfaces being substantially parallel and separated by a distance T,
   B. a first SAW-to-plate mode coupler on a first of said surfaces, said first coupler including:
      first SAW converting means for converting a portion of an incident SAW to a bulk acoustic wave (BAW), said first SAW converting means including a plurality of parallel linear surface perturbations, and
      first BAW converting means for converting a portion of an incident BAW to a SAW, said first BAW converting means including said plurality of surface perturbations,
   C. a first BAW reflector on the first of said surfaces including means for reflecting a portion of an incident BAW,
   D. a second BAW reflector on the second of said surfaces including means for reflecting a portion of an incident BAW,
   wherein said second BAW reflector is positioned to reflect a portion of BAW's incident thereon and propagating from said first SAW converting means and said first BAW reflector, to said first BAW converting means, and
   wherein said first BAW reflector is positioned to reflect a portion of BAW's incident thereon and propagating from said second BAW reflector, to said second BAW reflector, and
   whereby SAW's propagating on said first surface at said first BAW converting means reasonably interact with SAW's produced on said first surface by first BAW converting means, and
   further comprising a second SAW-to-plate mode coupler on said second surface, said second coupling including:
      second BAW converting means for converting a portion of an incident BAW to a SAW, said second BAW converting means including a plurality of parallel linear surface perturbations, and
      second SAW converting means for converting a portion of an incident SAW to a BAW, said second SAW converting means including said plurality of surface perturbations,
   wherein said second BAW converting means is positioned to convert to SAW's a portion of BAW's incident thereon and propagating from said first SAW converting means and said first BAW reflector,
   wherein said second SAW converting means is positioned so that a portion of BAW's from said second SAW converting means is incident on said first BAW reflector,
   whereby SAW's propagating on said second surface at said second BAW converting means resonantly interact with SAW's produced on said second surface by said second BAW converting means, and
   wherein said surface perturbations of said first surface coupler are substantially periodic, having period $P_1$, and wherein said surface perturbations of said second surface coupler are substantially periodic, having period $P_2$, and
   wherein $P_1$ differs from $P_2$, and wherein said first and second couplers are mutually positioned whereby at least a portion of a BAW generated by an incident SAW at one of said couplers is coupled to the other coupler.

2. A SAW device according to claim 1 further comprising:
   an input transducer coupled to said first surface on one side of said first and second couplers, said input transducer including means for generating a SAW on said first surface having a velocity component directed toward said first coupler, and
   an output transducer coupled to said second surface on said one side of said first and second couplers, said output transducer including means for receiving a SAW propagating on said second surface and having a velocity component directed away from said second coupler, and including means for converting said received SAW to a signal representative thereof, whereby the transfer function between said input and output transducers is characterized by a single pass-band having a center frequency with a corresponding wavelength between $P_1$ and $P_2$.

3. A SAW device according to claim 2 wherein $P_1$ is greater than the wavelength corresponding to said center frequency and wherein said second coupler includes a portion displaced with respect to said first coupler in the direction of propagation of a SAW generated by said first transducer.

4. A SAW device according to claim 2 wherein $P_1$ is less than the wavelength corresponding to said center frequency and wherein said second coupler includes a portion displaced with respect to said first coupler in the direction opposite to the direction of propagation of a SAW generated by said first transducer.

5. A surface acoustic wave (SAW) device comprising:
   A. a crystal substrate having two substantially planar surfaces, said planar surfaces being substantially parallel and separated by a distance T,
   B. a first SAW-to-plate mode coupler on a first of said surfaces, said first coupler including:
      first SAW converting means for converting a portion of an incident SAW to a bulk acoustic wave (BAW), said first SAW converting means including a plurality of parallel linear surface perturbations, and first BAW converting means for converting a portion of an incident BAW to a SAW, said first BAW converting means including said plurality of surface perturbations, C. a first BAW reflector on the first of said surfaces including means for reflecting a portion of an incident BAW, D. a second BAW reflector on the second of said surfaces including means for reflecting a portion of an incident BAW, wherein said second BAW reflector is positioned to reflect a portion of BAW's incident thereon and propagating from said first SAW converting means and said first BAW reflector, to said first BAW converting means, and wherein said first BAW reflector is positioned to reflect a portion of BAW's incident thereon and propagating from said second BAW reflector, to said second BAW reflector, and whereby SAW's propagating on said first surface at said first BAW converting means resonantly interact with SAW's produced on said first surface by said first BAW converting means, and further comprising a second SAW-to-plate mode coupler on said second surface, said second coupler including:

second BAW converting means for converting a portion of an incident BAW to a SAW, said second BAW converting means including a plurality of parallel linear surface perturbations, and second SAW converting means for converting a portion of an incident SAW to a BAW, said second SAW converting means including said plurality of surface perturbations, wherein said second BAW converting means is positioned to convert to SAW's a portion of BAW's incident thereon and propagating from said first SAW converting means and said first BAW reflector, wherein said second SAW converting means is positioned so that a portion of BAW's from said second SAW converting means is incident on said first BAW reflector, whereby SAW's propagating on said second surface at said second BAW converting means resonantly interact with SAW's produced on said second surface by said second BAW converting means, and wherein said surface perturbations of said first surface coupler are substantially periodic, having period $P_1$, and wherein said surface perturbations of said second surface coupler are substantially periodic, having period $P_2$, and further comprising:

a third SAW-to-plate mode coupler on said first surface, and a fourth SAW-to-plate mode coupler on said second surface, wherein said third coupler is substantially identical to said first coupler, and said fourth coupler is substantially identical to said second coupler, wherein further $P_1$ differs from $P_2$, and wherein said first and second couplers are mutually positioned whereby at least a portion of a BAW generated by an incident SAW at one of said first and second couplers is coupled to the other coupler, and wherein said third and fourth couplers are mutually positioned whereby at least a portion of a BAW generated by an incident SAW at one of said third and fourth couplers is coupled to the other coupler.

6. A SAW device according to claim 5 further comprising:

an input transducer coupled to one of said surfaces between the couplers on that surface, said input transducer including means for generating a SAW on surface having a velocity component directed toward one or both of said couplers on that surface.

7. A SAW device according to claim 5 further comprising:

an output transducer coupled to one of said surfaces between the couplers on that surface, said output transducer including means for receiving a SAW propagating on that surface and having a velocity component directed away from one or both of the couplers on that surface, and including means for converting said received SAW to a signal representative thereof.

8. A surface acoustic wave (SAW) device comprising:

A. a crystal substrate having two substantially planar surfaces, said planar surfaces being substantially parallel and separated by a distance T, B. a first SAW-to-plate mode coupler on a first of said surfaces, said first coupler including:

first SAW converting means for converting a portion of an incident SAW to a bulk acoustic wave (BAW), said first SAW converting means including a plurality of parallel linear surface perturbations, and first BAW converting means for converting a portion of an incident BAW to a SAW, said first BAW converting means including said plurality of surface perturbations, C. a first BAW reflector on the first of said surfaces including means for reflecting a portion of an incident BAW, D. a second BAW reflector on the second of said surfaces including means for reflecting a portion of an incident BAW, wherein said second BAW reflector is positioned to reflect a portion of BAW's incident thereon and propagating from said first SAW converting means and said first BAW reflector, to said first BAW converting means, and wherein said first BAW reflector is positioned to reflect a portion of BAW's incident thereon and propagating from said second BAW reflector, to said second BAW reflector, and wherein SAW's propgating on said first surface at said first BAW converting means resonantly interact with SAW's produced on said first surface by said first BAW converting means, and further comprising a second SAW-to-plate mode coupler on said first surface, said second coupler including:

means for converting a portion of an incident BAW to a SAW at a plurality of parallel linear surface perturbations, and means for converting a portion of an incident SAW to a BAW at said plurality of said surface perturbations, wherein said surface perturbations of said first surface coupler are substantially periodic, having period $P_1$, and wherein said surface perturbations of said second surface coupler are substantially periodic, having period $P_2$, wherein $P_1$ differs from $P_2$, and wherein said first and second couplers are mutually positioned whereby at least a portion of a BAW generated by an incident SAW at one of said couplers is coupled to the other coupler, and further comprising:

means for generating an input SAW on said first surface having a velocity component directed toward one of said couplers, and means for receiving a SAW propagating on said first surface and having a velocity component directed away from the other of said couplers, and opposite to said velocity component of said input SAW, and a SAW interrupter means on said first surface between said first and second couplers, said SAW interrupter means including means for substantially interrupting a SAW propagating on said first surface from said generating means and towards said other coupler and said receiving means, whereby the transfer function between said generating and receiving means is characterized by a single passband having a center frequency with a corresponding SAW wavelength between $P_1$ and $P_2$.

9. A SAW device according to claim 8 wherein $P_1$ is greater than the wavelength corresponding to said center frequency.

* * * * *